United States Patent
Nakao et al.

(10) Patent No.: US 6,975,200 B2
(45) Date of Patent: Dec. 13, 2005

(54) MICROCONVERTER AND LAMINATED MAGNETIC-CORE INDUCTOR

(75) Inventors: Fumiaki Nakao, Tokyo (JP); Yasuo Yamashita, Tokyo (JP); Teruo Kiyomiya, Tokyo (JP); Tetsuya Suzuki, Tokyo (JP); Masayuki Inagaki, Tokyo (JP); Mikio Kitaoka, Tokyo (JP)

(73) Assignee: FDK Corporation, Tokyo (JP)

( * ) Notice: Subject to any disclaimer, the term of this patent is extended or adjusted under 35 U.S.C. 154(b) by 0 days.

(21) Appl. No.: 11/034,272

(22) Filed: Jan. 12, 2005

(65) Prior Publication Data

US 2005/0134420 A1 Jun. 23, 2005

Related U.S. Application Data

(62) Division of application No. 10/624,379, filed on Jul. 22, 2003, now Pat. No. 6,885,278.

(30) Foreign Application Priority Data

Jul. 26, 2002 (JP) ..................................... 2002-218484

(51) Int. Cl.⁷ ................................................ H01F 5/00
(52) U.S. Cl. ..................................... 336/200; 336/231
(58) Field of Search ........................... 336/65, 83, 200, 336/206–208, 231–234; 257/531

(56) References Cited

U.S. PATENT DOCUMENTS

| | | | |
|---|---|---|---|
| 2,485,666 A | * | 10/1949 | Silver .......................... 336/182 |
| 4,845,452 A | | 7/1989 | Sasaki et al. |
| 5,027,255 A | | 6/1991 | Zeitlin et al. |
| 5,225,969 A | | 7/1993 | Takaya et al. |
| 5,770,991 A | * | 6/1998 | Baird ........................... 336/83 |
| 6,169,470 B1 | * | 1/2001 | Ibata et al. ................... 336/83 |
| 6,362,525 B1 | | 3/2002 | Rahim |
| 6,420,953 B1 | * | 7/2002 | Dadafshar .................... 336/200 |
| 6,456,183 B1 | | 9/2002 | Basteres et al. |
| 6,731,521 B2 | | 5/2004 | Yasumura |
| 2004/0090298 A1 | * | 5/2004 | Masu et al. .................. 336/200 |

FOREIGN PATENT DOCUMENTS

JP 61-142721 * 6/1986

* cited by examiner

*Primary Examiner*—Tuyen T Nguyen
(74) *Attorney, Agent, or Firm*—Harness, Dickey & Pierce, P.L.C.

(57) ABSTRACT

A surface-mount microconverter is formed by mounting a microinductor chip and a semiconductor integrated circuit chip on a circuit board. Stud terminals are arranged on the circuit board and the microinductor chip is supported on the stud terminals, and the microinductor chip and the semiconductor integrated circuit chip are superposed on the circuit board. The microconverter has an improved ability and is small and thin. The microconverter includes an effective laminated magnetic-core inductor. The inductor comprises a helical coil formed by uniting alternately superposed insulating magnetic layers and conductive pattern layers, and an annular closed magnetic path formed by the insulating magnetic layers and defining a magnetic field created by the coil. The inductor can be miniaturized in a thin chip, and a wide range in which magnetic flux density varies linearly can be secured by balancing a closed magnetic path for a magnetic field created by the coil.

11 Claims, 14 Drawing Sheets

(ENLARGED CROSS SECTION OF PART LABELED A)

(ENLARGED CROSS SECTION
OF PART LABELED A)

(ENLARGED CROSS SECTION
OF PART LABELED A)

(ENLARGED CROSS SECTION OF PART LABELED A)

(EQUIVALENT CIRCUIT)

(A-A CROSS SECTION)

(ENLARGED VIEW IN THICKNESS DIRECTION)

FIG. 10A
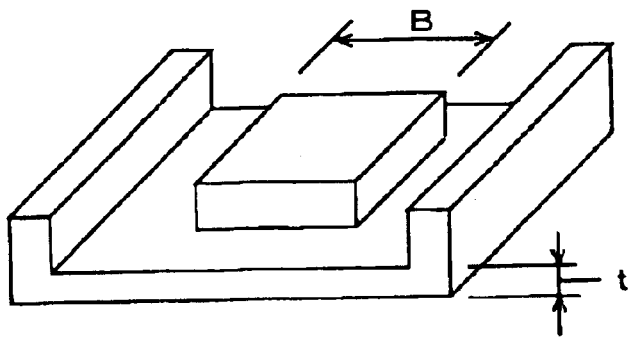
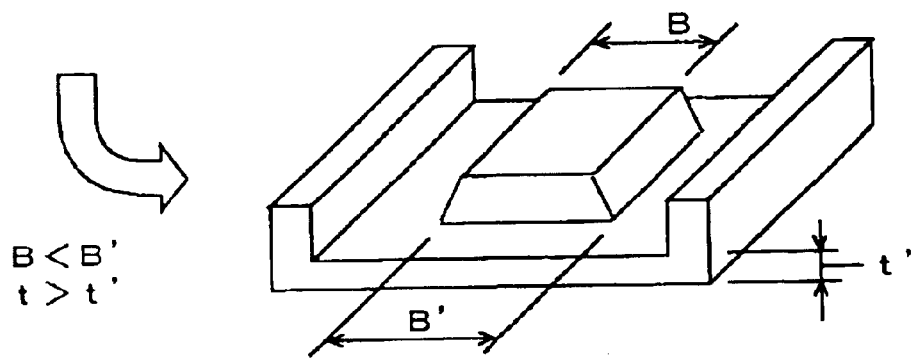
FIG. 10B
B < B'
t > t'
FIG. 10C
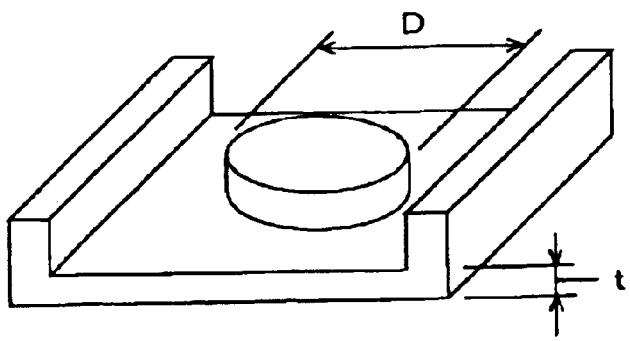
FIG. 10D
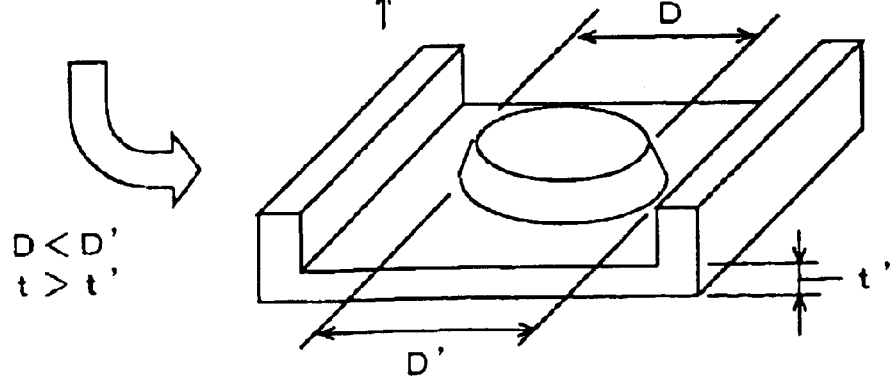
D < D'
t > t'

(A-A CROSS SECTION)

(A-A CROSS SECTION)

(A-A CROSS SECTION)

(A-A CROSS SECTION)

(ENLARGED VIEW IN THICKNESS DIRECTION)

MICROCONVERTER AND LAMINATED MAGNETIC-CORE INDUCTOR

CROSS-REFERENCE TO RELATED APPLICATIONS

This application is a divisional of U.S. patent application Ser. No. 10/624,379 filed on Jul. 22, 2003 now U.S. Pat. No. 6,885,278. This application also claims the benefit of Japanese Patent Application No. 2002-218484 filed Jul. 26, 2002. The disclosure(s) of the above application(s) are incorporated herein by reference.

BACKGROUND OF THE INVENTION

1. Field of the Invention

The present invention relates to a microconverter and a laminated magnetic-core inductor. More particularly, the present invention relates to techniques effectively applicable to a microminiature dc—dc converter to be mounted on a surface-mount circuit board (SM circuit board), generally called a microconverter, and a laminated magnetic-core inductor, i.e., a principal component of the microconverter, to be used for converting a supply voltage (electromotive force) of a built-in battery included in a portable information device, such as a portable telephone, into a predetermined working voltage to be applied to a circuit.

2. Description of the Related Art

A portable information device, such as a portable telephone, is provided with a dc—dc converter to convert the supply voltage (electromotive force) of a built-in battery into a working voltage to be applied to a circuit. The dc—dc converter includes an inductor, a main switching device and a control circuit. Technology relating to ICs (semiconductor integrated circuits) has made a remarkable progress in recent years, and the principal circuit elements including the main switching device and excluding the inductor have been replaced with an IC. Consequently, the principal components of the dc—dc converter are only an IC and an inductor. A dc—dc converter can be formed on a circuit board of an electronic apparatus by mounting the IC and the inductor on the circuit board.

The miniaturized dc—dc converter to be mounted on a circuit board is called a microconverter and is mounted together with other microdevices thereon included in a portable information device.

Although the IC having a comparatively high power capacity, i.e., one of the two principal components of the microconverter, is sufficiently miniaturized by fine processing techniques for fabricating semiconductor devices, it is difficult to miniaturize the inductor, particularly, the inductor included in a power unit, not to speak of forming the inductor in an IC. Thus, it may safely be said that the inductor is substantially the principal component of the microconverter, and the performance of the microconverter is greatly dependent on the performance of the inductor.

Generally, an inductor included in a power circuit, such as a dc—dc converter, is a transformer or a choke coil. The transformer and the choke coil are magnetic-core inductors each formed by winding a wire in a coil on a magnetic core. Therefore, the inductor is difficult, as compared with other electronic parts, to miniaturize and to form in a small thickness.

SUMMARY OF THE INVENTION

Accordingly, it is an object of the present invention to provide a microconverter capable of being mounted in a small area on a SM circuit board and of enabling the miniaturization and functional enhancement of electronic devices including portable telephones.

Another object of the present invention is to provide techniques capable of providing a small, thin magnetic-core laminated inductor formed by laminating insulating magnetic layers and conductive pattern layers, capable of securing a wide linear range of variation of magnetic flux density and suitable for use in which direct currents are superposed.

According to a first aspect of the present invention, there is provided a microconverter for converting and stabilizing supply voltage comprising: a microinductor formed like a chip; and a semiconductor integrated circuit chip including a control circuit and mounted on a circuit board to form a module; wherein stud terminals are arranged on the circuit board to support the microinductor thereon, the stud terminals connect the microinductor and the circuit board electrically and mechanically and serve as buffer spacers spacing the microinductor and the circuit board, the microinductor and the semiconductor integrate circuit chip are superposed on the circuit board, the stud terminals connect the microinductor and the semiconductor integrated circuit chip to form a dc—dc converter on the circuit board, and the circuit board is provided with side terminals for surface-mounting the circuit board on a wiring board included in an associated device and for connecting the dc—dc converter to a circuit formed on the wiring board of the associated device.

According to a second aspect of the present invention, there is provided a laminated magnetic-core inductor comprising: a helical coil formed by uniting alternately superposed insulating magnetic layers and conductive pattern layers; and an annular closed magnetic path formed by the insulating magnetic layers and defining a magnetic field created by the coil; wherein the coil has an inside diameter increasing toward the opposite open ends thereof to form the closed magnetic path extending through the coil in a uniform sectional area.

According to a third aspect of the present invention, there is provided a laminated magnetic-core inductor comprising: a helical coil formed by uniting alternately superposed insulating magnetic layers and conductive pattern; and an annular closed magnetic path formed by the insulating magnetic layers and defining a magnetic field created by the coil; wherein a magnetic gap is formed selectively in the insulating magnetic layers to uniformize the irregular distribution of magnetic flux density due to the irregular distribution of magnetomotive force of the coil.

According to a fourth aspect of the present invention, there is provided a laminated magnetic-core inductor comprising: a helical coil formed by uniting alternately superposed insulating magnetic layers and conductive pattern layers; and an annular closed magnetic path formed by the insulating magnetic layers and defining a magnetic field created by the coil; wherein the insulating magnetic layers have an inside part extending in the closed magnetic path defined by the coil, and an outside part extending around the closed magnetic path defined by the coil, the coil has opposite ends connected by conductive lead lines to terminal electrodes corresponding to the opposite ends thereof, respectively, the coil has a part where the number of superposed conductive pattern layers is n (n is an integer not smaller than 1) and a part where the number of the superposed conductive pattern layers is n+1, the width of the outside part in which a magnetic field is created by the n+1 conductive pattern layers is smaller than that of the outside part in which a magnetic field is created by the n conductive pattern layers to uniformize the magnetic permeability of the closed magnetic path.

The above and other objects, features and advantages of the present invention will become more apparent from the following description taken in connection with the accompanying drawings.

BRIEF DESCRIPTION OF THE DRAWINGS

FIGS. 10A to 10D are typical perspective views, respectively, of bulk E-type magnetic cores representing the magnetic body of the laminated magnetic-core inductor shown in FIG. 7A;

Refer to the following description in connection with the accompanying drawings for the complete understanding of the present invention and its advantages.

DETAILED DESCRIPTION OF THE PREFERRED EMBODIMENTS

At least the following matters will be known from the description and the drawings provided in this specification.

COMPARATIVE EXAMPLE

The inventors of the present invention studied packaging techniques to miniaturize a microconverter, and studied techniques for miniaturizing and particularly reducing the thickness of the inductor, i.e., the principal component of the microconverter.

Figure 15A:
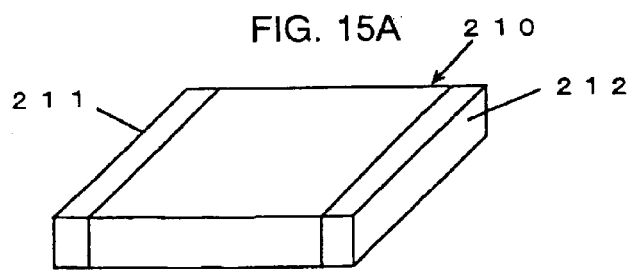
FIGS. 15A to 15D are a perspective view of a magnetic-core laminated inductor examined prior to making the present invention, a view of a conductive pattern layer, a sectional view taken on line A—A in FIG. 15B, and an enlarged sectional view obtained by enlarging the sectional view shown in FIG. 15C in the direction of the thickness of the laminated magnetic-core inductor, respectively.
Figure 15B:
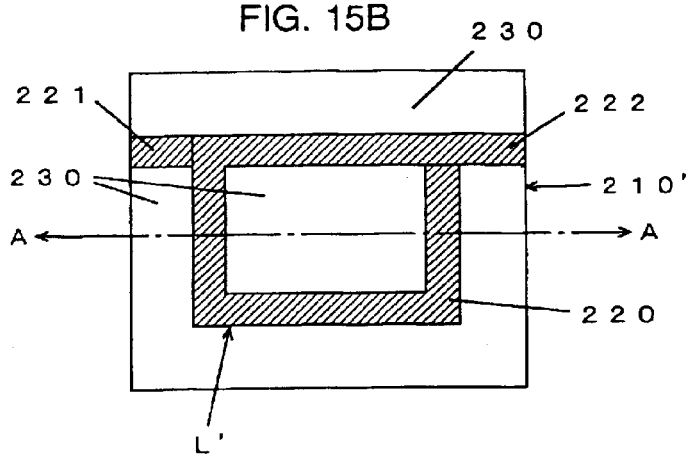
Figure 15C:
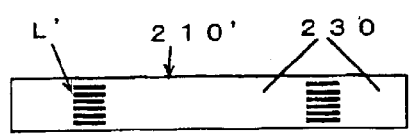
Figure 15D:
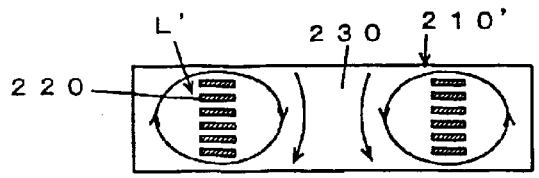

The inventors of the present invention studied a laminated magnetic-core inductor shown in FIGS. 15A to 15D prior to making the present invention. FIG. 15A is a perspective view of the laminated magnetic-core inductor, FIG. 15B is a fragmentary view of a conductive pattern layer, FIG. 15C is a sectional view taken on line A—A in FIG. 15C, and FIG. 15D is an enlarged sectional view obtained by enlarging the sectional view shown in FIG. 15C in the direction of the thickness of the laminated magnetic-core inductor.

A laminated inductor not provided with any magnetic core is formed by laminating nonmagnetic, insulating layers and conductive pattern layers formed by screen printing or the like. A laminated magnetic-core inductor 210' shown in FIGS. 15A to 15D is formed by laminating insulating magnetic layers (soft-magnetic layers) 230 and conductive pattern layers 220 formed by screen printing or the like. The conductive pattern layers 220 and the insulating magnetic layers 230 are superposed alternately so as to form a spiral coil L'. The insulating magnetic layers 230 form an annular, closed magnetic path defining a magnetic field created by the coil L'. The opposite ends of the coil L' are connected by conductive lines 221 and 222 to terminal electrodes 211 and 212 at the opposite ends of an inductor chip, respectively. It should be noted that the laminated magnetic-core inductor 210' is an inductor studied by the inventors of the present invention prior to making the present invention and is not a known technique proposed prior to the present invention.

The laminated magnetic-core inductor 210' is mounted on a SM circuit board to form a principal part of a microconverter.

The microconverter and the laminated magnetic-core inductor as above described have the following problems in characteristic and structure.

First, problems in the microconverter will be described.

As mentioned above, an inductor, i.e., one of the two principal components of an IC and an inductor, of a dc—dc converter is available in a miniaturized, laminated inductor chip. However, it is difficult to form the inductor chip as small as an IC chip. In particular, an inductor for use in a dc—dc converter that serves as part of a power circuit cannot extremely be miniaturized like an IC. Naturally, it is impossible to form the inductor in an IC.

The portable telephone or the like employs a SM circuit board for functional improvement and miniaturization, and component parts are miniaturized to increase packaging density. However, the inductor is an exception. Therefore, the dc—dc converter occupies a relatively large area on the SM circuit board and is a significant impediment to the miniaturization and functional improvement of portable telephones and such. The comparatively large inductor is subject to a large bending strain when the SM circuit board is bent and deformed and, hence, the inductor is liable to be cracked or broken in its mounted state.

The electronic information device, such as the portable telephone, uses a microprocessor to carry out various functions. The expansion of the functions is dependent on the processing ability, particularly, the processing speed of the microprocessor. However, the operation of the microprocessor at a high processing speed entails increased power consumption. The reduction of the supply voltage of the power supply is an effective means for improving the processing ability without entailing increased power consumption. The power supply of a low supply voltage needs a dc—dc converter.

The portable telephone is desired to be able to reduce transmission power according to the intensity of a receiving electric field to use a frequency effectively and to extend the life of the built-in battery. However, in a conventional portable telephone, the reduction of transmission power does not necessarily lead to reducing power consumption. Power consumption decreases scarcely even if transmission power is reduced greatly, because transmission power is controlled variably according to bias conditions and the like without changing the supply voltage of the power supply for a radio output circuit. If the supply voltage of the power supply for the radio output circuit is controlled variably at a low loss by a dc—dc converter, the power consumption can be reduced according to the reduction of transmission power, so that the frequency can be effectively used and the life of the built-in battery can be extended.

The dc—dc converter must be provided for each of circuits, such as a microprocessor and radio output circuit to realize the aforesaid technique. However, the use of a plurality of dc—dc converters that need a large area for installation in a device obstructs the miniaturization of the device and hence there have been difficulties in using the plurality of dc—dc converters. It is difficult to assign a mounting space to a dc—dc converter on a SM circuit board and hence the dc—dc converter cannot necessarily be placed at a proper place.

Problems in the laminated magnetic-core inductor 210' shown in FIGS. 15A to 15D will be described.

Figure 16:
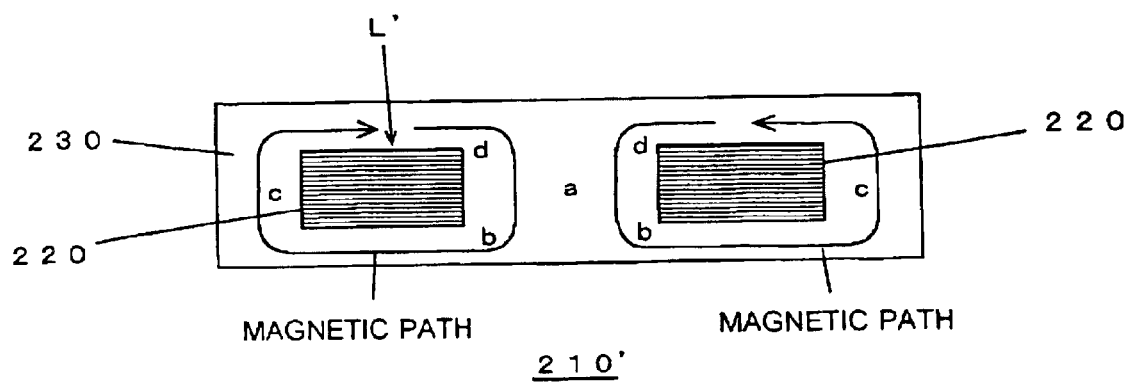
FIG. 16 is a typical sectional view of the magnetic-core laminated inductor shown in FIGS. 15A to 15D.

The inventors of the present invention found the following problems in this laminated magnetic-core inductor 210'. In the laminated magnetic-core inductor 210', the insulating magnetic layers 230 form an annular, closed magnetic path defining a magnetic field created by the coil L' as shown in FIG. 16. The effective sectional area of the closed magnetic path is not uniform and varies widely from position to position on the magnetic path; that is, the sectional areas of parts of the magnetic path with respect to the length of the magnetic path scatters in a wide range.

Figure 17:
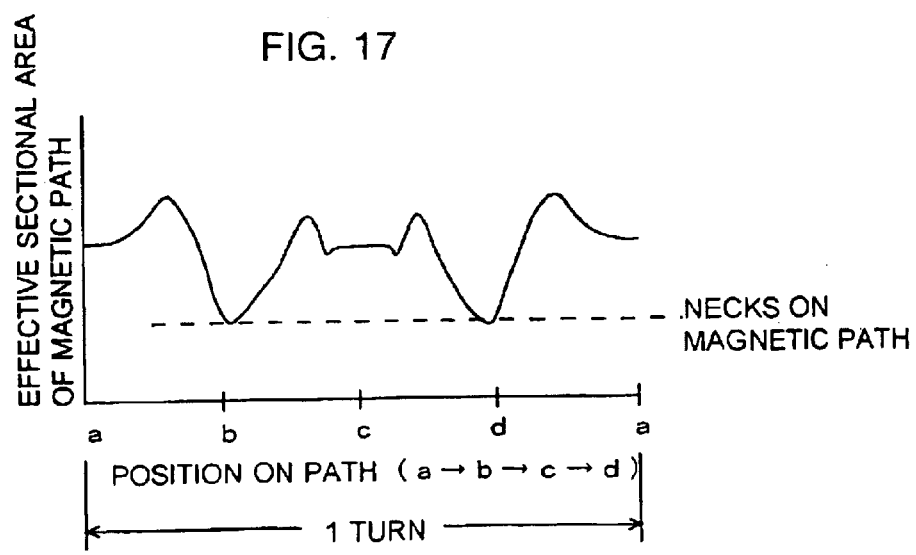
FIG. 17 is a graph of assistance in explaining the variation of the sectional area of a magnetic path included in the laminated magnetic-core inductor shown in FIGS. 15A to 15D.

FIG. 16 is a typical sectional view of the laminated magnetic-core inductor 210' shown in FIGS. 15A to 15D. As shown in FIG. 16, the closed magnetic path is a circular path successively having parts a-b-c-d. The parts a, b, c and d of the closed magnetic path differ greatly from each other in effective sectional area as shown in FIG. 17. The difference between a large sectional area (a part between the parts a and b, and a part between the parts d and a) and a small sectional area (a part between the parts b and d) is large; that is, the magnetic path is greatly unbalanced.

The unbalanced magnetic path deteriorates the linearity of the variation of magnetic flux density with magnetomotive force of the coil L'. A part having a small sectional area of the magnetic path is magnetically saturated before other parts of the magnetic path are saturated and thereby the inductance is reduced sharply even if a high current is supplied to the coil to increase the magnetomotive force. Thus, the parts b and d having the smallest sectional area are necks dominating the magnetic permeability of the closed magnetic path. The necks having small sectional areas in the closed magnetic path narrow a range generally called a linear range in which magnetic flux density varies linearly even if other parts have large sectional areas. In the typical sectional view shown in FIG. 16, it was found that the necks of the magnetic path are in the parts b and d, which are corners in the vicinity of the opposite ends of the coil L', and those necks narrow the linear range.

Generally, in a power circuit, such as a dc—dc converter, a direct current is superposed on the inductor. Therefore, the widest possible linear range must be secured. However, the laminated magnetic-core inductor 210' is unable to secure a wide linear range. Magnetic loss is concentrated on the necks in the magnetic path and heat generated in the necks cause troubles. Thus, the aforesaid laminated magnetic-core inductor 210' is unsuitable for use in a power circuit, such as a dc—dc converter.

Although it is effective to form the magnetic core formed of the magnetic layers 230 of the laminated magnetic-core inductor 210' in a sufficiently large volume, particularly, in a sufficiently big thickness, to expand the linear range in which magnetic flux density varies linearly, an increase in the volume or the thickness of the magnetic core is inconsistent with the miniaturization, particularly, the reduction of the thickness of the inductor 210'.

(First Embodiment)

Figure 1A:
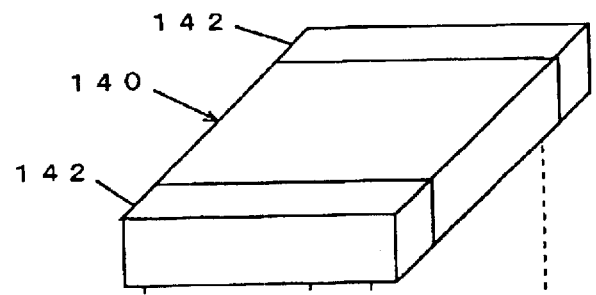
FIGS. 1A to 1D are an exploded perspective view, a perspective view, a schematic side elevation and a circuit diagram of an equivalent circuit, respectively, of a microconverter in a first embodiment according to the present invention.
Figure 1B:
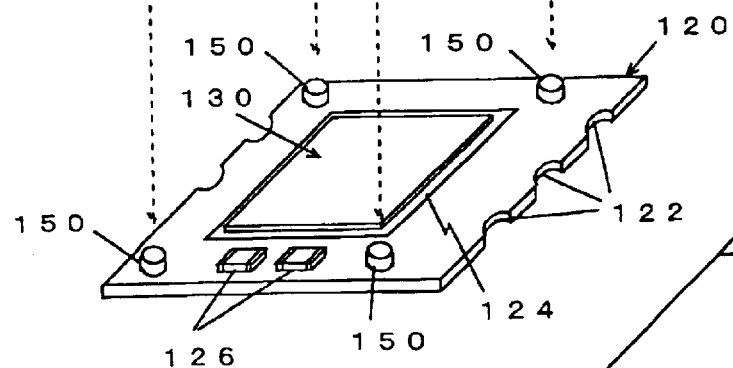
Figure 1B:
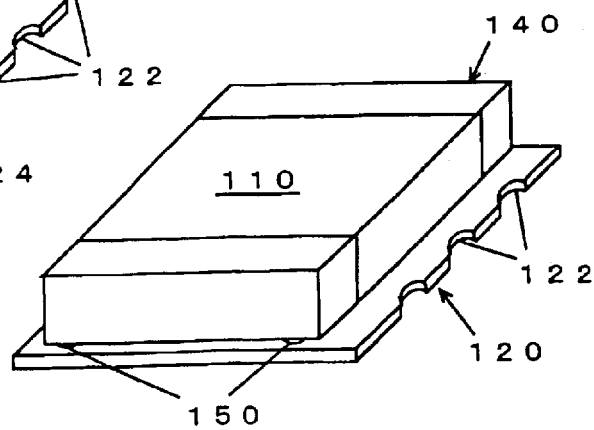
Figure 1C:
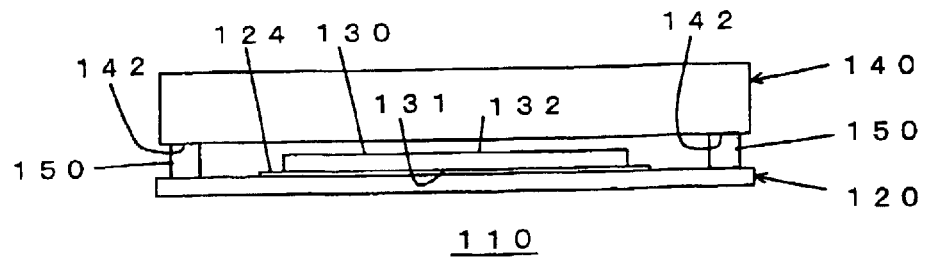
Figure 1D:
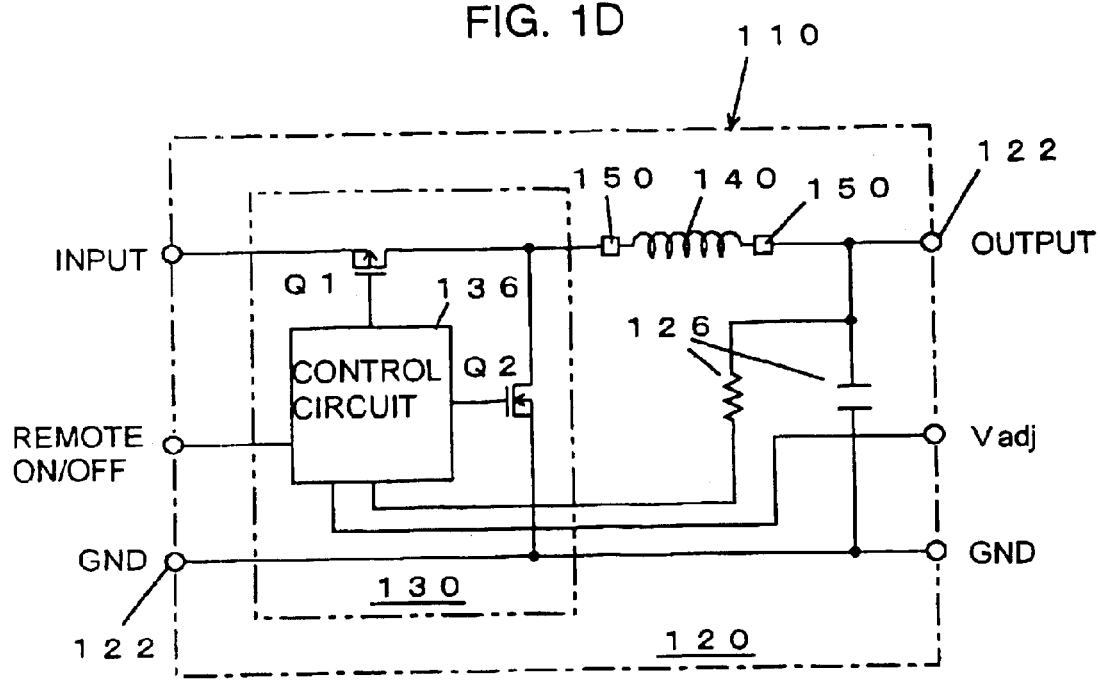
Figure 1E:
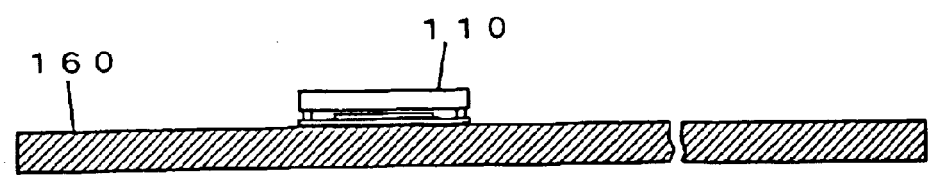
FIG. 1E is a schematic sectional view of the microconverter shown in FIGS. 1A to 1D as mounted on a SM circuit board.

FIGS. 1A to 1D are an exploded perspective view, a perspective view, a schematic side elevation and a circuit diagram of an equivalent circuit, respectively, of a microconverter in a first embodiment according to the present invention, and FIG. 1E is a schematic sectional view of the microconverter shown in FIGS. 1A to 1D as mounted on a SM circuit board.

Referring to FIGS. 1A to 1E, a microconverter 110 is a dc—dc converter module to be surface-mounted on a SMT (Surface-Mount Technology) board 160. The microconverter 110 includes a circuit board 120, a semiconductor integrated circuit chip (hereinafter, abbreviated to "IC chip") 130, a microinductor 140, and stud terminals 150.

The circuit board 120 is a SM circuit board and serves also as a support plate for supporting the module. The SM circuit board 120 is provided with SM electrodes and a wiring pattern on its upper surface, and side terminals 122 for surface mounting in its side surfaces. The IC chip 130, the stud terminals 150 and some CR parts 126 are attached to the upper surface of the SM circuit board 120 by a reflow soldering method.

The IC chip 130 is a monolithic IC formed on a single silicon substrate. The IC chip 130 has MOS transistors Q1 and Q2, i.e., main switching devices, and a control circuit 136 for the loop-control of the switching operations of the MOS transistors Q1 and Q2. The IC chip 130 is surface-mounted on the circuit board 120 with its circuit-forming surface 131 facing the mounting-surface of the circuit board 120. The IC chip 130 is provided with electrodes on its circuit-forming surface 131 to connect the IC chip 130 electrically to the circuit board 120. The IC chip 130 is fastened to the circuit board 120 with an underfil 124 of a thermosetting resin.

The microinductor 140 is a magnetic-core inductor formed in a chip of layered construction. The microinductor 140 has terminal electrodes 142 at its opposite ends. The microinductor 140 is supported on the stud terminals 150 disposed at the four corners, respectively, of the circuit board 120. The upper ends of the stud terminals 150 are electrically and mechanically connected to the terminal electrodes 142 by a reflow soldering method.

The stud terminals 150 have a height sufficient to form spacer terminals for spacing the microinductor 140 from the IC chip 130 by a space of a very small thickness, and are somewhat elastic and flexible. Thus, the stud terminals 150 are able to absorb force that may act on and strain the microinductor 140 when the circuit board 120 is bent and deformed. The stud terminals 150 are formed of a material having a high electric conductivity, such as metal, and the upper and lower surfaces of the stud terminals 150 are formed of a solderable material. The upper ends and the lower ends of the stud terminals 150 are soldered to the terminal electrodes 142 of the microinductor 140 and to the circuit board 120, respectively, by a reflow soldering method.

The microconverter 110 is surface-mounted on the SMT board 160 of a portable telephone or the like with the side terminals 122 of the circuit board 120 bonded to terminals formed on the SMT board 160 by a reflow soldering method. The microconverter 110 is mounted simultaneously with other parts on the SMT board 160. Even though the microinductor 140 is very large as compared with the IC chip or other chips, such as resistor chips and capacitor chips, the microinductor 140 will not directly be affected by a strain in the SMT board 160 when the SMT board 160 is bent slightly because the microinductor 140 is supported by the stud terminals 150 having a mechanical cushioning function and capable of absorbing the deformation of the SMT board 160 on the circuit board 120. The stud terminals 150 connect the microinductor 140 electrically and mechanically to the circuit board 120 and space the microinductor 140 apart from the circuit board 120. Those functions of the stud terminals 150 are effective in surely preventing the cracking of the microinductor 140. Since the number of the stud terminals 150 may be equal to that of the terminal electrodes 142, the cost of the stud terminals 150 is insignificant.

The microinductor 140 overlies the IC chip 130 on the circuit board 120. Therefore, the microconverter 110 needs a small mounting area on the SMT board 160. In this embodiment, the IC chip 130 is mounted on the circuit board 120 with its circuit-forming surface 131 facing the upper mounting surface of the circuit board 120. Thus, the semiconductor substrate of the IC chip 130 electromagnetically shields the circuit of the IC chip 130 from the microinductor 140. The circuit of the IC chip 130 is formed only in a thin surface region of the semiconductor substrate and the semiconductor substrate is grounded. Therefore, the mounting of the IC chip 130 with its back surface 132 facing the microinductor 140 is effective in preventing inductive interference between the IC chip 130 and the microinductor 140.

(Second Embodiment)

Figure 2A:
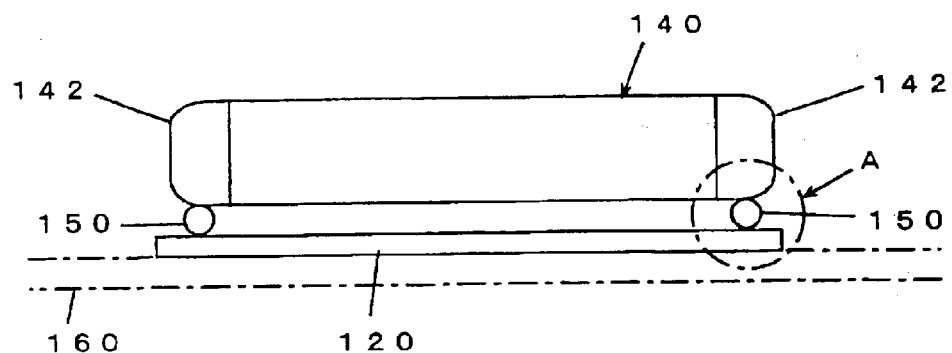
FIGS. 2A and 2B are a schematic side elevation and an enlarged fragmentary sectional view, respectively, of a microconverter in a second embodiment according to the present invention.
Figure 2B:
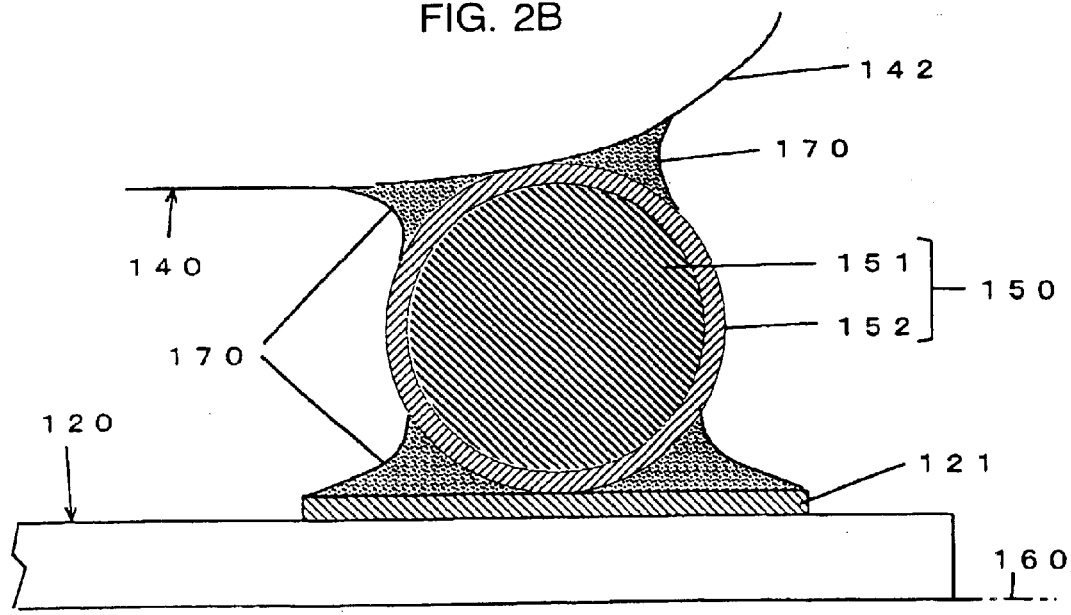

FIGS. 2A and 2B are a schematic side elevation and an enlarged fragmentary sectional view, respectively, of a microconverter in a second embodiment according to the present invention.

Matters relating to the second embodiment and different from those relating to the first embodiment will be described. Referring to FIGS. 2A and 2B, a microconverter in the second embodiment is provided with spherical stud terminals 150. The spherical stud terminals 150 are formed by coating resin balls 151 of a heat-resistant, elastic resin with a satisfactorily solderable (solder-wettable) metal layer 152. The spherical stud terminals 150, similarly to the aforesaid columnar stud terminals 150, are interposed between a circuit board 120 and the terminal electrodes 142 of a microinductor 140 to connect the circuit board 120 with the microinductor 140 electrically and mechanically. The spherical stud terminals 150, similarly to the columnar stud terminals 150, have a satisfactory cushioning function of cushioning spacers that prevents the direct influence of a strain in a SMT board 160 on the microinductor 140 when the SMT board 160 is bent.

Whereas the columnar stud terminals 150 need a positioning operation for setting the columnar stud terminals 150 upright on the circuit board 120, the spherical stud terminals 150 do not need such a positioning operation. The spherical stud terminals 150 are able to function as cushioning spacers regardless of their position.

Desirably, edges of the microinductor 140 are rounded to prevent chipping. Even if the edges of the terminal electrodes 142 are rounded, the spherical stud terminals 150 can be bonded electrically and mechanically to curved parts of the surfaces of the terminal electrodes 142 with solder 170 without adjusting the positions of the spherical stud terminals 150 according to the shape of the curved parts. When the spherical stud terminals 150 are soldered to electrodes 121 formed on the circuit board 120 by a reflow soldering method, the surface tension of molten solder draws the spherical stud terminals 150 to the centers of the terminals 121, so that the spherical stud terminals 150 are aligned automatically relative to the corresponding terminals 121.

(Third Embodiment)

Figure 3A:
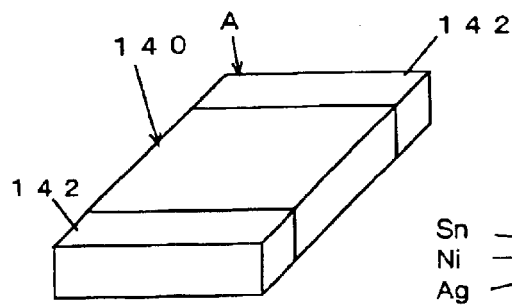
FIGS. 3A and 3B are a perspective view and a typical sectional view, respectively, of a terminal electrode included in a microinductor to be included in a microconverter in a third embodiment according to the present invention.
Figure 3B:
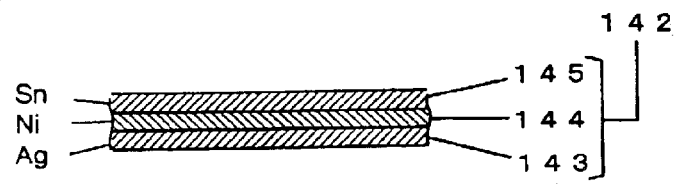

FIGS. 3A and 3B are a perspective view and a typical sectional view, respectively, of a microinductor 140 included in a microconverter in a third embodiment according to the present invention. FIG. 3B is an enlarged sectional view of a part A in FIG. 3A.

Referring to FIGS. 3A and 3B, each of terminal electrodes 142 of the microinductor 140 is formed by successively stacking a silver layer 143 by electroless plating, a nickel layer 144 and a tin layer 145 in that order. The top tin layer 145 is satisfactorily solderable.

(Fourth Embodiment)

Figure 4A:
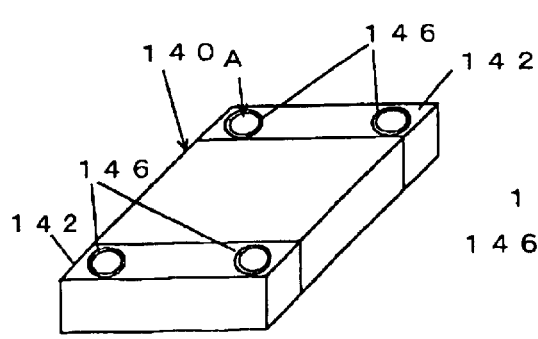
FIGS. 4A and 4B are a perspective view and a typical sectional view, respectively, of a terminal electrode included in a microinductor to be included in a microconverter in a fourth embodiment according to the present invention.
Figure 4B:
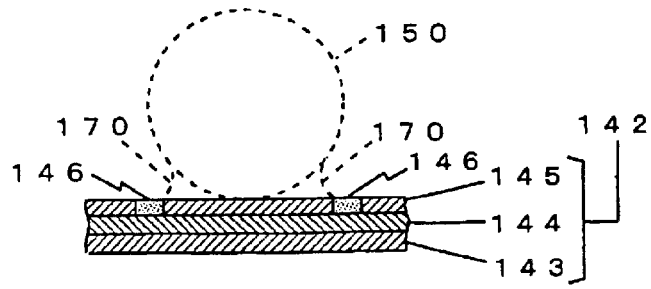

FIGS. 4A and 4B are a perspective view and a typical sectional view, respectively, of a microinductor 140 to be included in a microconverter in a fourth embodiment according to the present invention. FIG. 4B is an enlarged sectional view of a part A in FIG. 4A. In the fourth embodiment, circular mask patterns 146 are formed so as to surround parts of a nickel layer 144 corresponding to parts of a top tin layer 145 to which stud terminals 150 are to be soldered before depositing the top tin layer 146. Thus, the parts of the top tin layer 145 to which the stud terminals 150 are to be soldered are demarcated by the circular mask patterns 146 to form circular lands. When the stud terminals 150 are soldered to the circular lands by a reflow soldering method, the mask patterns 146 prevent solder from flowing outside the circular lands and hence satisfactory soldering can be achieved.

(Fifth Embodiment)

Figure 5A:
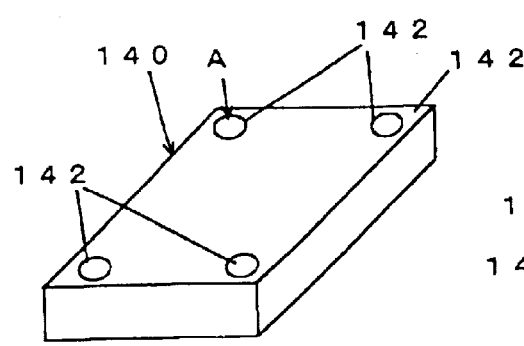
FIGS. 5A and 5B are a perspective view and a typical sectional view, respectively, of a terminal electrode included in a microinductor to be included in a microconverter in a fifth embodiment according to the present invention.
Figure 5B:
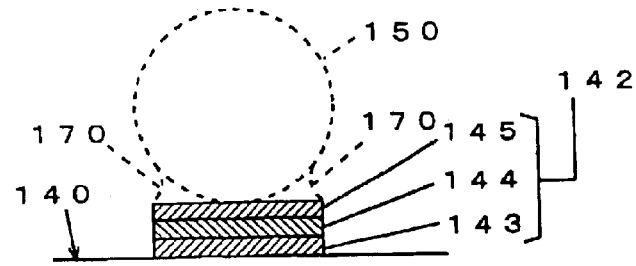

FIGS. 5A and 5B are a perspective view and a typical sectional view, respectively, of a microinductor 140 to be included in a microconverter in a fifth embodiment according to the present invention. FIG. 5B is an enlarged sectional view of a part A in FIG. 5A. In the fifth embodiment, plated layers 143, 144 and 145 are formed so as to form only circular lands that serve as electrodes to which stud terminals 150 are soldered. When the stud terminals 150 are soldered to the circular lands by a reflow soldering method, the circular lands prevent the needless flow of solder and hence satisfactory soldering can be achieved.

(Sixth Embodiment)

Figure 6A:
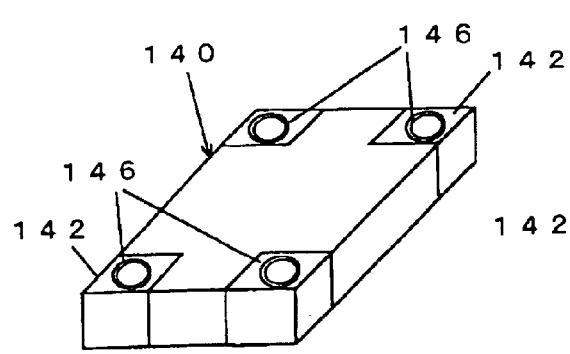
FIGS. 6A and 6B are a perspective view of a microinductor to be included in a microconverter in a sixth embodiment according to the present invention and a circuit diagram of an equivalent circuit of the microinductor, respectively.
Figure 6B:
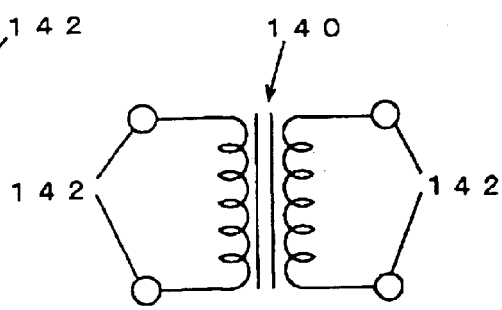

FIGS. 6A and 6B are a perspective view of a microinductor 140 to be included in a microconverter in a sixth embodiment according to the present invention and a circuit diagram of an equivalent circuit of the microinductor 140, respectively.

The microinductors 140 of the microconverters in the first to the fifth embodiments are choke coils. The microinductor 140 of the microconverter in the sixth embodiment is a transformer including primary and secondary coils. A dc—dc converter having electrically isolated input and output sides can be formed by using the microinductor 140 having the construction of a transformer.

Although the microconverters in the preferred embodiments of the present invention have been described, various modifications thereof are possible. For example, the IC chip 130 does not necessarily need to be a monolithic device, and a plurality of chips may be used instead of the IC chip 130.

Laminated magnetic-core inductors according to the present invention will be described hereinafter.

(Seventh Embodiment)

Figure 7A:
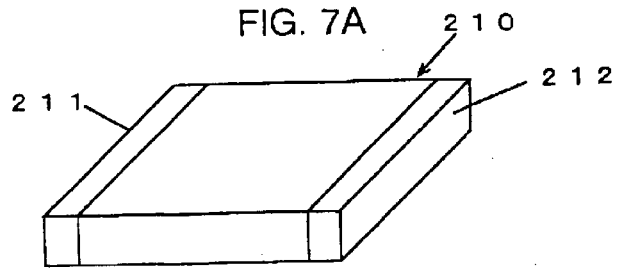
FIGS. 7A to 7D are a perspective view of a magnetic-core laminated inductor in a seventh embodiment according to the present invention, a view of a conductive pattern layer, a sectional view taken on line A—A in FIG. 7B, and an enlarged sectional view obtained by enlarging the sectional view shown in FIG. 7C in the direction of the thickness of the laminated magnetic-core inductor, respectively.
Figure 7B:
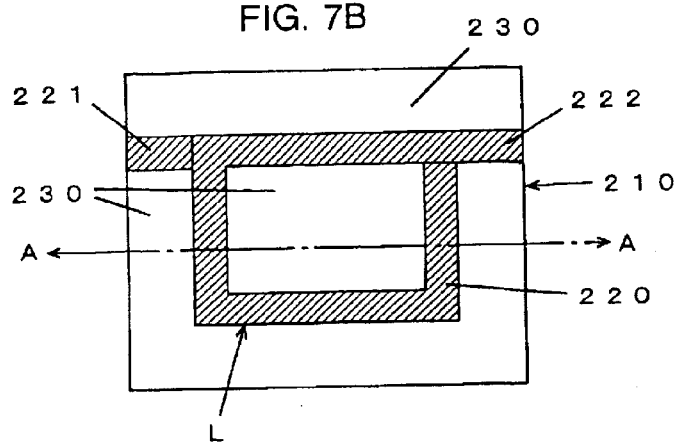
Figure 7C:
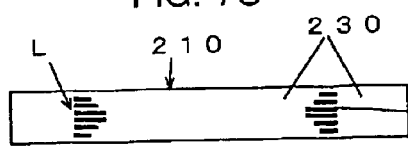

FIGS. 7A to 7D are a perspective view of a magnetic-core laminated inductor 210 in a seventh embodiment according to the present invention, a view of a conductive pattern layer, a sectional view taken on line A—A in FIG. 7B, and an enlarged sectional view obtained by enlarging the sectional view shown in FIG. 7C in the direction of the thickness of the laminated magnetic-core inductor, respectively.

The magnetic-core laminated inductor 210 shown in FIGS. 7A to 7D is a surface-mount chip. The laminated magnetic-core inductor 210 is suitable for replacing the microinductor 140, which is a principal component of the aforesaid microconverter 110.

A coil chip included in the magnetic-core laminated inductor 210 is formed by alternately stacking insulating magnetic layers (soft-magnetic layers) 230 and conductive patterns 220 by screen printing or the like. The conductive patterns 220 sandwiched between the insulating magnetic layers 230 form a helical coil L. In the seventh embodiment, each of the conductive patterns 220 has straight conductive lines perpendicularly intersecting each other and hence the coil L has a rectangular cross section.

The insulating magnetic layers 230 form an annular magnetic path for a magnetic field created by the coil L. Opposite ends of the coil L are connected by conductive lead lines 221 and 222 to terminal electrodes 211 and 212 at the opposite ends of the coil chip of the magnetic-core laminated inductor 210, respectively. The terminal electrodes 211 and 212 are symmetrical with respect to the coil chip.

Figure 7D:
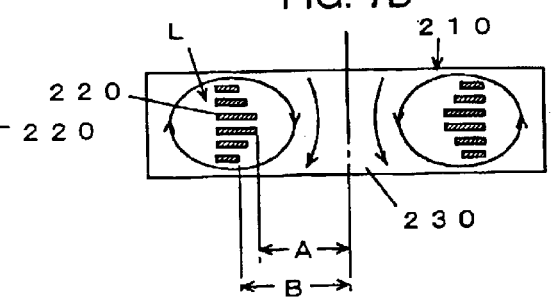

As shown in FIGS. 7C and 7D, in this magnetic-core laminated inductor 210, the conductive patterns 220 are arranged so as to form the helical coil L. Inside diameters of opposite end parts of the coil L are increased gradually so that the opposite end parts of the coil L are flared. Therefore, the conductive patterns 220 forming a middle part of the coil L are formed of comparatively wide conductive lines in a relatively small inside diameter A, while the conductive patterns 220 forming opposite end parts of the coil L are formed of comparatively narrow conductive lines in a relatively-big inside diameter B as shown in FIG. 7D.

Figure 8:
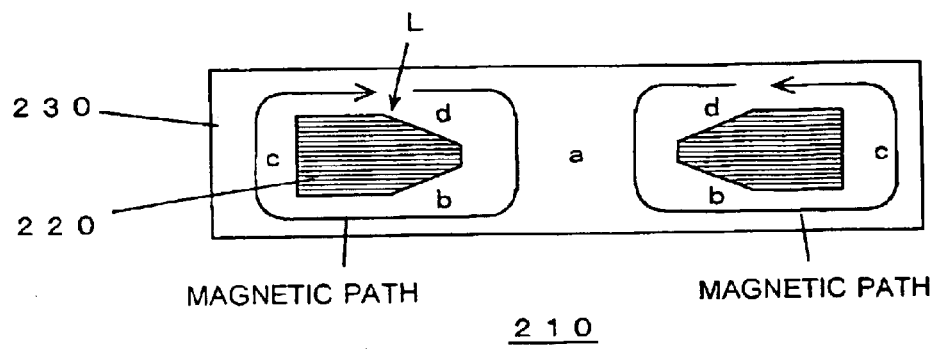
FIG. 8 is a sectional view of the laminated magnetic-core inductor shown in FIG. 7A.
Figure 9:
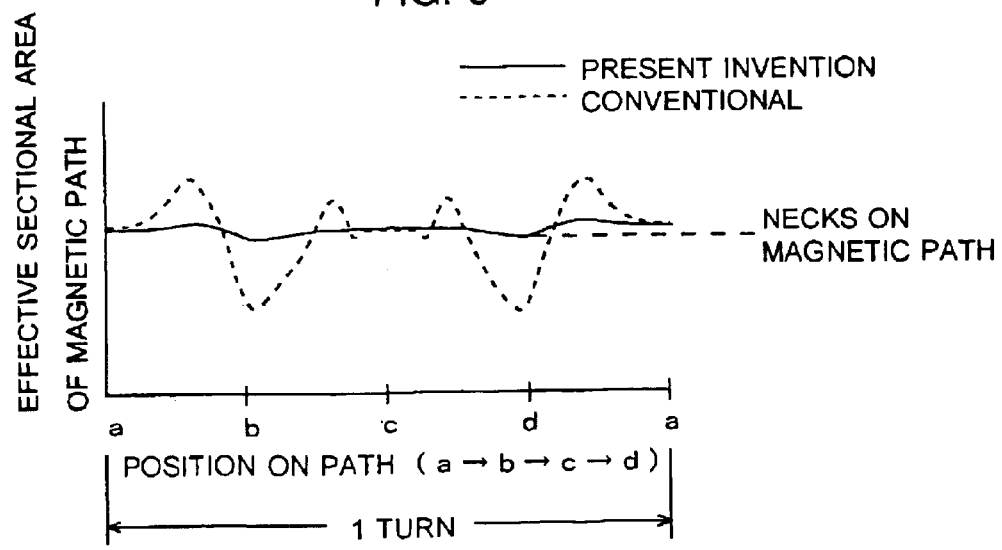
FIG. 9 is a graph showing the variation of the sectional area of a magnetic path in the laminated magnetic-core inductor shown in FIG. 7A.

As shown in FIG. 8, the insulating conductive layers 230 of the magnetic-core laminated inductor 210 form an annular, closed magnetic path extending outside and inside the coil L. The sectional areas (effective sectional areas) of parts a, b, c and d of the closed magnetic path are distributed in a narrow range as shown in FIG. 9 because the opposite end parts of the coil L are flared. Thus, the coil L has a substantially uniform sectional area. In FIG. 9, a curve represented by a continuous line indicates the variation of the sectional area of the magnetic path in the magnetic-core laminated inductor 210 in the seventh embodiment, and a curve represented by a broken line indicates the variation of the sectional area of the magnetic path in the conventional inductor 210' previously described in connection with FIG. 16.

When the sectional area of the magnetic path varies in a narrow range, a high magnetic permeability can be secured until the closed magnetic path is saturated. Consequently, the magnetic-core laminated inductor 210 can be miniaturized and can be formed in a small thickness, is capable of securing a wide linear range of variation of magnetic flux density, and is suitable for use as a dc—dc converter in which direct currents are superposed. Moreover, since magnetic loss is distributed over the entire closed magnetic path, heat generation due to the concentration of magnetic loss on a particular part can be avoided.

When the magnetic-core laminated inductor 210 is formed such that the sectional area of an inside part a, inside the coil L, of the magnetic path and the sectional area of an outside part c, outside the coil L, of the magnetic path are equal to each other, the balance of the magnetic path can further be improved. The magnetic-core laminated inductor 210 meets such a condition when the sectional area of a part of the outside part of the magnetic path outside the coil and that of a part of the inside part of the magnetic path corresponding to a middle part of the coil L where the inside diameter of the coil L is A (FIG. 7D) are equal to each other. The conductive patterns of the coil L do not necessarily need to be rectangular and may be loops of any shape, such as circular loops.

FIGS. 10A to 10D show bulk E-type magnetic cores modeling the magnetic core of the magnetic-core laminated inductor 210. A bulk E-type magnetic core has a flat part, outside parts at the opposite ends of the flat part, and an inside part corresponding to a central part of the flat part. An E-type magnetic core having an inside part of a shape resembling a rectangular prism as shown in FIG. 10A can be modeled by a magnetic core having an inside part of a shape resembling a truncated pyramid as shown in FIG. 10B. An E-type magnetic core having an inside part of a shape resembling a cylinder as shown in FIG. 10C can be modeled by a magnetic core having an inside part of a shape resembling a truncated cone as shown in FIG. 10D.

Suppose that the inside part of the magnetic core model shown in FIG. 10A has sides of a length (diameter) B, and the flat part of the same has a thickness t. Then the sectional area A1 of an annular part along the joints of the sides of the inside part and the flat part is expressed by: $A1=4 \times B \times t$. To balance the magnetic path between the inside part and the flat part, the sectional area A1 must be equal to the sectional area $A2=B \times B$ of the inside part. Thus, the thickness t must be determined so as to meet a condition: $t=B/4$.

The magnetic path of the magnetic core model shown in FIG. 10B can be balanced when the area of the top surface of the inside part is equal to the sectional area of an annular part along the root of the inside part. Suppose that the length of the sides of the top surface of the inner part is B, the length of the sides of the root of the inside part is B' and the thickness of the flat part is t'. Then, the area of the top surface is B×B, and the sectional area of the annular part is 4×B'×t'. Therefore, the thickness t' must be determined so that B×B=4×B'×t' and, therefore, t'=(B×B)/4×B'. This condition means that the magnetic path is balanced when the length B' is big even if the thickness t' is small. Thus, the thickness t' may be small and the magnetic core can be formed in a small thickness.

Suppose that the inside part of the magnetic core model shown in FIG. 10C has a diameter D, and the flat part of the same has a thickness t. Then the sectional area A1 of an annular part along the joint of the inside part and the flat part is expressed by: $A1=\pi \times D \times t$. The sectional area A2 of the inside part is expressed by: $A2=\pi(D/2)^2$. To balance the magnetic path between the inside part and the flat part, the thickness t must be determined so as to meet a condition: $t=D/4$.

Suppose that the top surface of the inside part of the magnetic core model shown in FIG. 10D has a diameter D and the root of the inside part has a diameter D', and the flat part of the same has a thickness t'. Then the area A2 of the top surface is $\pi(D/2)^2$, and the sectional area of an annular part along the joint of the root of the inside part and the flat part is π×D'×t'. The magnetic path between the inside part and the flat part can be balanced when the thickness t' meets a condition: $t'=D^2/4D'$. This condition, similarly to the condition for the magnetic core model shown in FIG. 10B, means that the magnetic path is balanced when the length D' is big even if the thickness t' is small. Thus, the thickness t' may be small and the magnetic core can be formed in a small thickness.

(Eighth Embodiment)

Figure 11A:
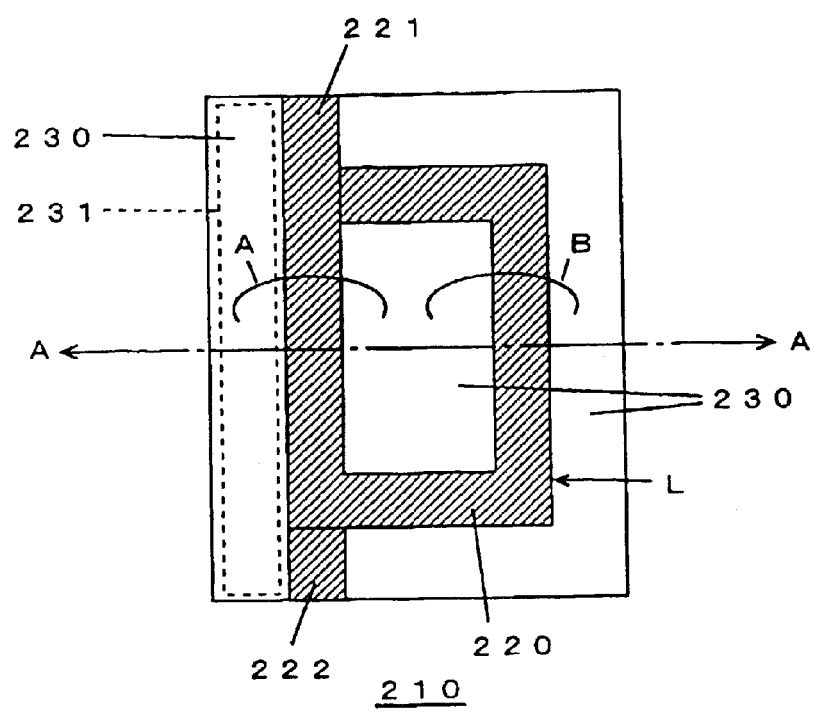
FIGS. 11A and 11B are a plan view and a sectional view, respectively, of a laminated magnetic-core inductor in an eighth embodiment according to the present invention.
Figure 11B:
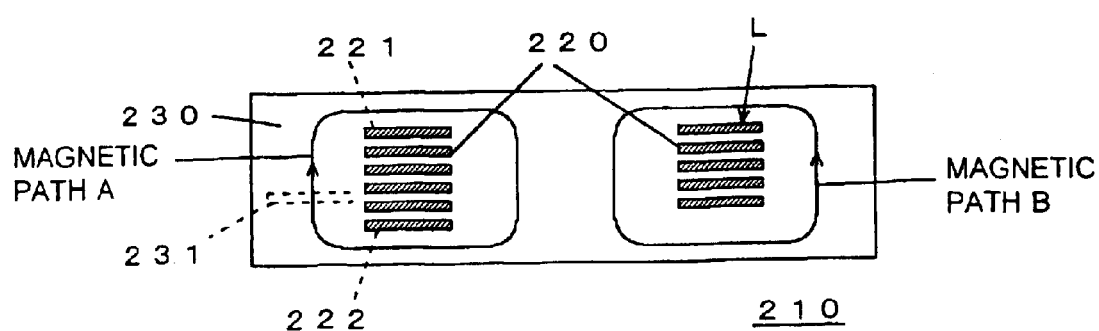

FIGS. 11A and 11B show a magnetic-core laminated inductor in an eighth embodiment according to the present invention.

Desirably, a laminated inductor formed in a surface-mount chip is provided with terminal electrodes 111 and 112 in a symmetrical arrangement as shown in FIG. 7A to omit a troublesome operation for determining the direction of the laminated inductor in surface-mounting the laminated inductor on a wiring board. As shown in FIG. 11A, the opposite ends of a coil L are connected to conductive lead lines 221 and 222 respectively extended in opposite directions. When the opposite ends of the coil L are connected to such conductive lead lines, the number of turns of the wire forming the coil L is not simply an integer. The number of turns of the wire of such a coil is a mixed decimal, such as n+¼ (n is an integer).

As shown in FIG. 11B, different parts of the coil L has different numbers of the superposed conductive patterns 220. The number of the superposed conductive patterns in some part of the coil L is n, while that of another part is n+1. If the wire is wound by a quarter of a turn in a part of the coil L where the number of the superposed conductive patterns 220 is n+1, the number of turns of the wire of the coil L is n+¼. The respective magnetomotive forces of the part where the number of the superposed conductive patterns 220 is n+1 and the part where the number of the superposed conductive patterns 220 is n are different from each other.

A part of the coil L corresponding to a magnetic path A on a side including the conductive lead lines 221 and 222 has one additional turn of the coil L, and hence the magnetomotive force of the coil L in the magnetic path A is higher than that in the other magnetic path B. The difference in magnetomotive force unbalances the magnetic path and spoils the linearity of change of magnetic flux density. When different parts of the coil L have different magnetomotive forces, respectively, the part having a higher magnetomotive force is magnetically saturated earlier than the other part and thereby the same problem as that caused by the magnetic path neck is caused even if the closed magnetic path has a uniform sectional area.

In the eighth embodiment, a magnetic gap 231 is formed selectively in the magnetic path A in which the magnetomotive force is higher. The magnetic gap 231 can be formed by an insulating nonmagnetic layer (magnetic permeability $\mu \approx 1$) or an insulating magnetic layer (soft-magnetic layer) having a relatively low magnetic permeability. More concretely, the magnetic gap can be formed by replacing some of the insulating magnetic layers 230 with layers having a low magnetic permeability. The magnetic gap 231 compensates for the uneven distribution of magnetomotive force due to the partial change of the number of turns of the wire of the coil L to ensure satisfactory magnetic balance.

(Ninth Embodiment)

Figure 12A:
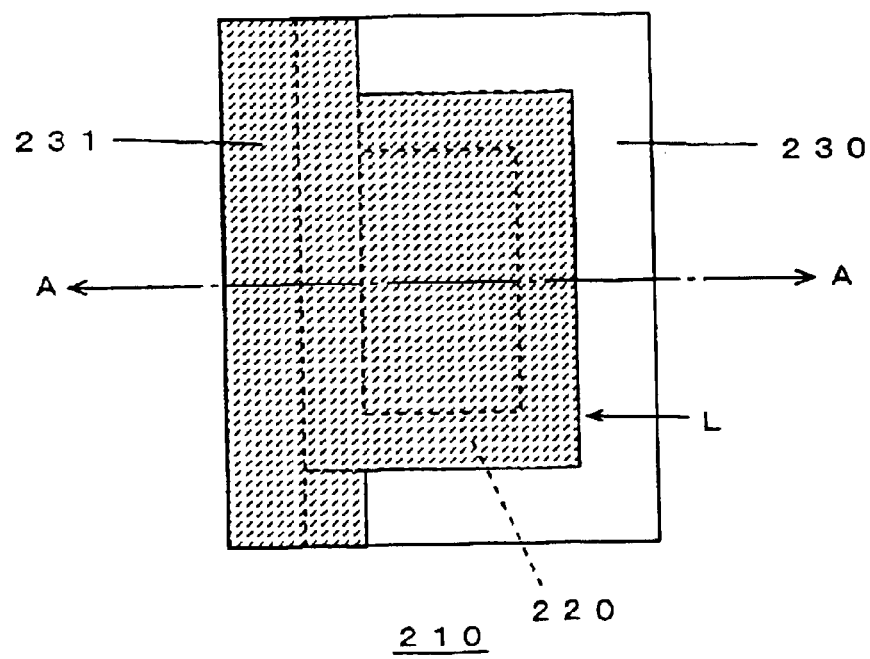
FIGS. 12A and 12B are a plan view and a sectional view, respectively, of a laminated magnetic-core inductor in a ninth embodiment according to the present invention.
Figure 12B:
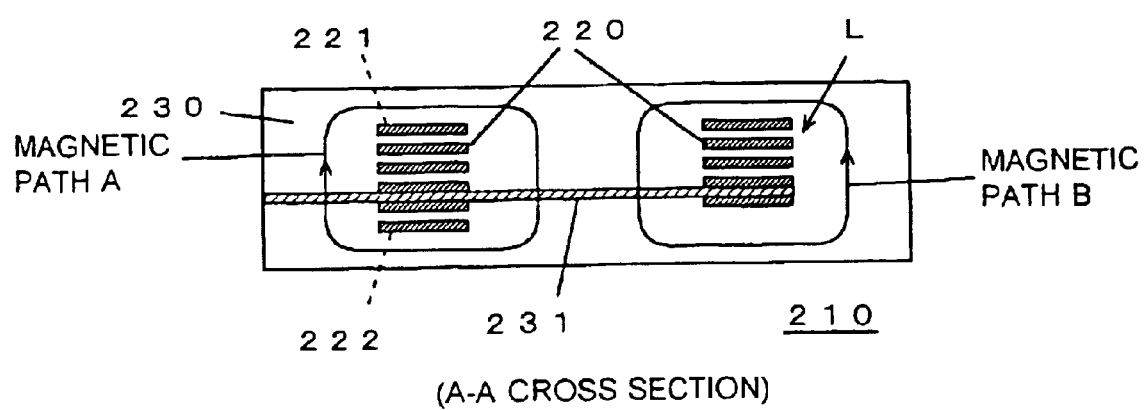

FIGS. 12A and 12B show a laminated magnetic-core inductor in a ninth embodiment according to the present invention. FIGS. 12A and 12B show a magnetic gap 231 more concretely. The magnetic gap 231 shown in FIGS. 11A and 11B is formed only in one of the outside parts of the E-type magnetic core. It is preferable to form a magnetic gap 231 in a pattern that extends across both one of two outside parts and an inside part as shown in FIGS. 12A and 12B in order to balance a magnetic path in the entire core.

(Tenth Embodiment)

Figure 13A:
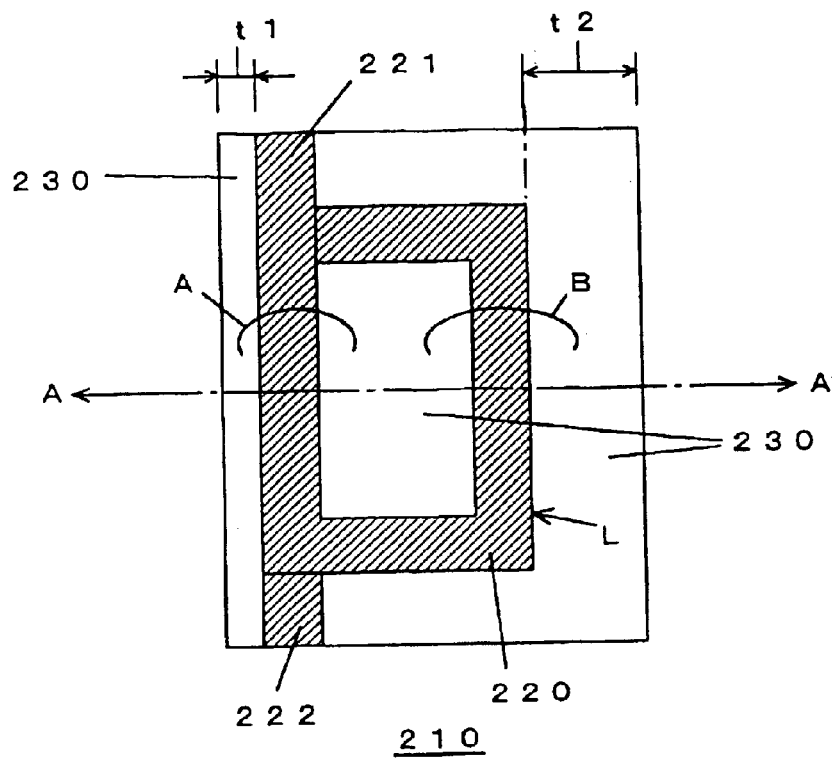
FIGS. 13A and 13B are a plan view and a sectional view, respectively, of a laminated magnetic-core inductor in a tenth embodiment according to the present invention.
Figure 13B:
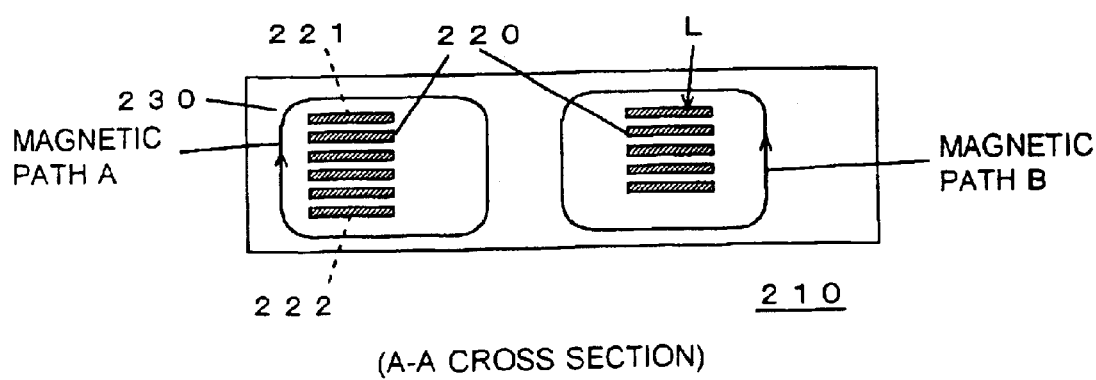

FIGS. 13A and 13B show a laminated magnetic-core inductor in a tenth embodiment according to the present invention. In this laminated magnetic-core inductor, the difference in area between the pair of outside parts of an E-type magnetic core compensates for the uneven distribution of magnetomotive force due to the local change of the number of turns of the wire of a coil L. As shown in FIGS. 13A and 13B, the formation of conductive lead lines 221 and 222 makes the width t1 of an outside part on the side of a magnetic path A in which a magnetic field is created by n+1 conductive patterns smaller than the width t2 of an outside part on the side of a magnetic path B in which a magnetic field is created by n conductive patterns. In other words, the width t1 of the outside part in which a magnetic field is created by the n+1 conductive pattern layers is smaller than the width t2 of the outside part in which a magnetic field is created by the n conductive pattern layers to uniformize the magnetic permeability of the closed magnetic path. Thus, the positional difference in magnetic flux density due to the uneven distribution of magnetomotive force can be compensated for and the magnetic path can satisfactorily be balanced.

Figure 14:
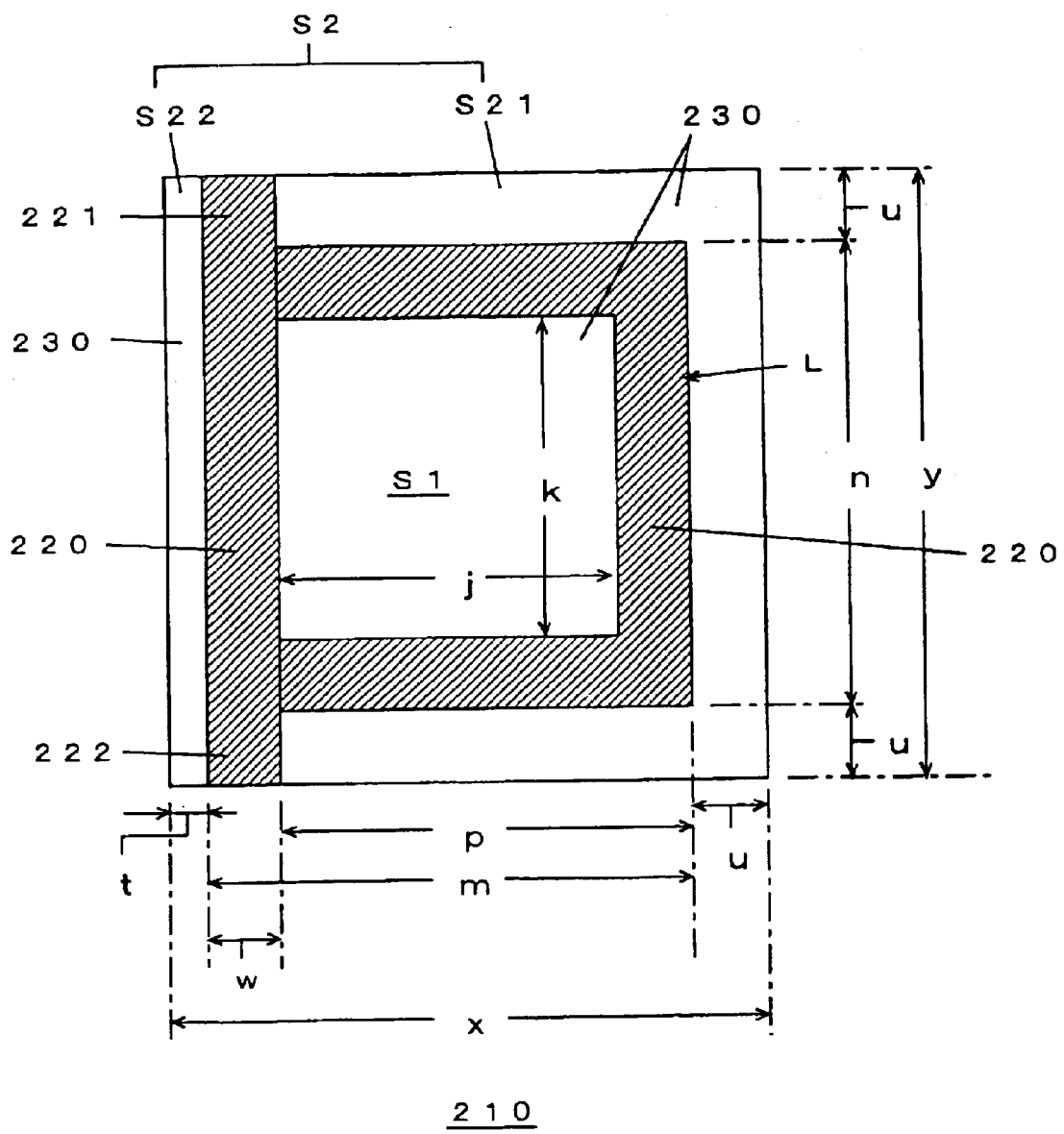
FIG. 14 is a view of assistance in explaining the dimensions of a laminated magnetic-core inductor according to the present invention.

FIG. 14 shows the dimensions of a rectangular conductive pattern 220 and a rectangular insulating magnetic layer 230 included in a laminated magnetic-core inductor. The magnetic path can be balanced when dimensions shown in FIG. 14 meet the following conditions.

(1) The area S22 of the pattern of an I-shaped outside part on the side of the conductive lead lines 221 and 222 is ⅕ or less of the area S21 of the pattern of a U-shaped part excluding the I-shaped outside part.

(2) The area S1 of the pattern of an inside part formed inside the coil L is approximately equal to the area S2 (=S21+S22) of an outside part including the I-shaped and the U-shaped part.

(3) The circumference (2×j+2×k) of the inside part is approximately equal to the length (2×u+n+2×p) of the boundary between the U-shaped outside part and the conductive pattern.

(4) The width t of the conductive lead lines 221 and 222, the width w of the I-shaped outside part extending along the conductive lead lines 221 and 222, and the length k of the boundary between the conductive lead lines 221 and 222 and the inside part meet a condition: (w+t)≈k/2.

Thus, the sectional area of the magnetic path in the inside part is transmitted effectively to the I-shaped outside part, and the magnetic path can satisfactorily be balanced.

Optimum values of the dimensions x, y, u, t, w and m shown in FIG. 14 meet Expressions (1), (2) and (3).

$$2u+n=y \tag{1}$$

$$t+u+m=x \tag{2}$$

$$(m-2w)(n-2w)=xy-mn-2wu \tag{3}$$

An optimum value of the width w of the I-shaped outside part meets expressions (1), (2) and (3).

Although the present invention has been described in terms of the laminated magnetic-core inductors in the preferred embodiments, the present invention is not limited thereto in its practical application and various modifications are possible. For example, the conductive patterns forming the coil L may have a circular shape, a rectangular shape having rounded corners.

The microconverter of the present invention for converting and stabilizing supply voltage can be mounted in a small area on a SMT board, which is effective in miniaturizing and improving the functions of electronic devices, such as portable telephones.

The laminated magnetic-core inductor formed by alternately stacking the insulating magnetic layers and the conductive patterns is small and thin, is capable of securing a wide linear range of variation of magnetic flux density and is suitable for uses in which direct currents are superposed. There are not any restrictions on the uses of the laminated magnetic-core inductor. The laminated magnetic-core inductor is very effective in miniaturizing and improving the functions of a microconverter.

Although the invention has been described in its preferred embodiments with a certain degree of particularity, it is to be understood that various changes, variations and modifications are possible therein without departing from the scope and spirit of the invention.

What is claimed is:

1. A laminated magnetic-core inductor comprising:
    a helical coil formed by uniting alternately superposed insulating magnetic layers and conductive pattern layers; and
    an annular closed magnetic path formed by the insulating magnetic layers and defining a magnetic field created by the coil;
    wherein the coil has an inside diameter increasing toward the opposite open ends thereof so that opposite end parts thereof are flared to form the closed magnetic path extending through the coil in a uniform sectional area.

2. A laminated magnetic-core inductor according to claim 1, wherein the conductive patterns forming a middle part of the coil are formed of relatively wide conductive lines and have a relatively small inside diameter, and the conductive patterns forming opposite end parts of the coil are formed of relatively narrow conductive lines and have a relatively big inside diameter.

3. A laminated magnetic-core inductor according to claim 1, wherein the conductive patterns have a rectangular shape having rectangular corners, and the coil has a rectangular cross section.

4. A laminated magnetic-core inductor comprising:
    a helical coil formed by uniting alternately superposed insulating magnetic layers and conductive pattern layers; and
    an annular closed magnetic path formed by the insulating magnetic layers and defining a magnetic field created by the coil;
    wherein a magnetic gap is formed selectively in the insulating magnetic layers to uniformize irregular distribution of magnetic flux density due to the irregular distribution of magnetomotive force of the coil.

5. A laminated magnetic-core inductor according to claim 4, wherein the magnetic gap is formed by replacing part of the magnetic layers with a layer having a relatively low magnetic permeability.

6. A laminated magnetic-core inductor according to claim 4, wherein opposite ends of the coil are connected by conductive lead lines to terminal electrodes corresponding to the opposite ends of the coil, respectively, and the number of turns of a wire of the coil is not an integer and is a mixed decimal.

7. A laminated magnetic-core inductor comprising:
    a helical coil formed by uniting alternately superposed insulating magnetic layers and conductive pattern layers; and
    an annular closed magnetic path formed by the insulating magnetic layers and defining a magnetic field created by the coil;
    wherein the insulating magnetic layers have an inside part extending in the closed magnetic path defined by the coil, and an outside part extending around the closed magnetic path defined by the coil,
    the coil has opposite ends connected by conductive lead lines to terminal electrodes corresponding to the opposite ends thereof, respectively, the coil has a part where the number of superposed conductive pattern layers is n (n is an integer not smaller than 1) and a part where the number of the superposed conductive pattern layers is n+1,
    the width of the outside part in which a magnetic field is created by the n+1 conductive pattern layers is smaller than that of the outside part in which a magnetic field is created by the n conductive pattern layers to uniformize the magnetic permeability of the closed magnetic path.

8. A laminated magnetic-core inductor according to claim 7, wherein an area of a pattern of an I-shaped outside part on the side of the conductive lead lines is ⅕ or less of an area of the pattern of a U-shaped part excluding the I-shaped outside part.

9. A laminated magnetic-core inductor according to claim 7, wherein an area of a pattern of an inside part formed inside the coil is approximately equal to an area of a pattern of an outside part around the coil.

10. A laminated magnetic-core inductor according to claim 9, wherein a circumference of the inside part is approximately equal to a length of a boundary between the U-shaped outside part and the conductive pattern.

11. A laminated magnetic-core inductor according to claim 7, wherein a width t of the conductive lead lines, a width w of the I-shaped outside part extending along the conductive lead lines, and a length k of the boundary between the conductive lead lines and the inside part meet a condition: (w+t)≈k/2.

* * * * *